(12) United States Patent
Sauer

(10) Patent No.: US 6,392,465 B1
(45) Date of Patent: May 21, 2002

(54) SUB-THRESHOLD CMOS INTEGRATOR

(75) Inventor: Don Sauer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/740,296

(22) Filed: Dec. 18, 2000

(51) Int. Cl.[7] .................................................. G06G 7/18
(52) U.S. Cl. ........................ 327/336; 327/337; 327/344
(58) Field of Search ................................. 327/107, 336, 327/337, 339, 344, 346; 330/17, 252

(56) References Cited

U.S. PATENT DOCUMENTS

| | | | |
|---|---|---|---|
| 4,782,305 A | * 11/1988 | Westwick et al. | ........... 330/107 |
| 5,313,121 A | * 5/1994 | Cianci et al. | ............... 327/103 |
| 5,793,242 A | 8/1998 | Sauer | ........................ 327/336 |
| 5,838,197 A | * 11/1998 | Tsukuda | ..................... 330/252 |

* cited by examiner

Primary Examiner—Tuan T. Lam
Assistant Examiner—Hiep Nguyen
(74) Attorney, Agent, or Firm—Merchant & Gould P.C.; Mark R. Hennings

(57) ABSTRACT

An integrator circuit having a relatively large RC time constant includes a resistive element implemented with a field effect transistor operated in a sub-threshold mode. The size of the field effect transistor is selected, in addition to the sub-threshold gate voltage, to achieve a desired resistance value in a small area and without using bipolar devices. A differential integrator circuit includes two field effect transistors operated in a sub-threshold mode, with a capacitor connected between the output terminals of the two field effect transistors. A bulk drive circuit can be optionally used to reduce high frequency in the bulk.

12 Claims, 5 Drawing Sheets

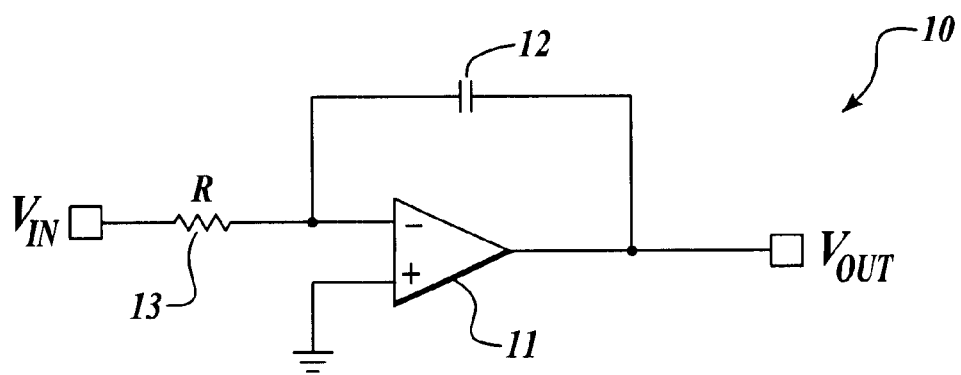
Fig. 1. *(PRIOR ART)*
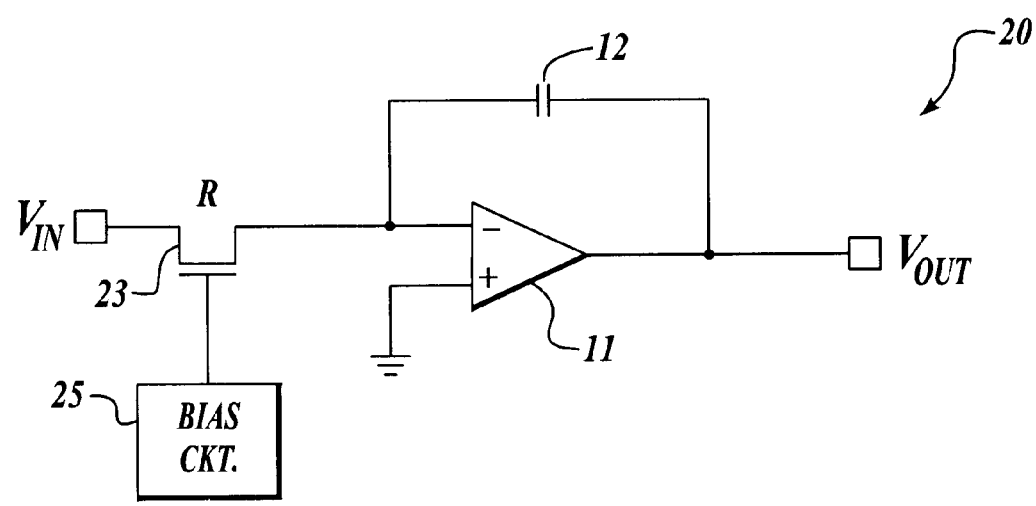
Fig. 2.

SUB-THRESHOLD CMOS INTEGRATOR

FIELD OF THE INVENTION

The present invention relates to electronic circuits and, more particularly, to integrator circuits.

BACKGROUND INFORMATION

FIG. 1 illustrates a conventional active RC integrator circuit 10 having an operational amplifier 11, a capacitor 12 and a resistor 13 with resistance R. Resistor 13 has one electrode connected to the inverting input terminal of operational amplifier 11 and the other electrode connected to receive an input signal $V_{IN}$. Capacitor 12 is connected between the output lead and inverting input terminal of operational amplifier 11. The non-inverting input terminal of operational amplifier 11 is connected to ground. In operation, input signal $V_{IN}$ is converted to a current by resistor 13, which is then integrated by capacitor 12 to provide an output signal $V_{OUT}$. Such integration circuits are commonly used in a wide variety of applications and may be tuned by manipulating the RC time constant of the feedback loop to operate over a range of frequencies.

In low frequency applications, the RC time constant of the feedback loop must be relatively large in order for the integrator to function properly. For example, in an audio application, the RC time constant is typically on the order of eight milliseconds. Further, the capacitor should be small to minimize the cost of fabricating a monolithic integrated circuit integrator circuit, typically having a capacitance no greater than twenty picofarad. Consequently, the resistor must have a resistance on the order of four hundred mega ohm. Such a large resistor can be fabricated, but conventional resistive elements in integrator applications generally require a relatively large amount of semiconductor real estate, which tends to increase fabrication costs.

SUMMARY

In accordance with aspects of the present invention, an integrator circuit having a relatively large RC time constant is provided. In one aspect of the present invention, the integrator circuit includes a resistive element implemented with a field effect transistor operated in a sub-threshold mode. By controlling the size of the field effect transistor in addition to the sub-threshold gate voltage, a desired resistance value can be achieved in a small area and without using bipolar devices, thereby decreasing fabrication costs and complexity.

In a further aspect of the present invention, the integrator circuit is fully differential with the integrating capacitor being implemented as a floating capacitor. In accordance with this aspect of the invention, the integrator circuit is only responsive to differential signals and allows integration to take place on both sides of the floating capacitor.

In another aspect of the present invention, the integrator circuit also includes a bulk drive circuit that uses the differential input signal to bias the bulk keep the bulk quiet. More particularly, the bulk drive circuit uses gate capacitance of matching bulk drive transistors to cancel high frequency noise.

BRIEF DESCRIPTION OF THE DRAWINGS

FIG. 1 illustrates a block diagram of a conventional integrator circuit.

FIG. 2 illustrates a block diagram of an integrator circuit having a resistor implemented with a field effect transistor biased in the sub-threshold mode, in accordance with one embodiment of the present invention.

DETAILED DESCRIPTION

Figure 3:
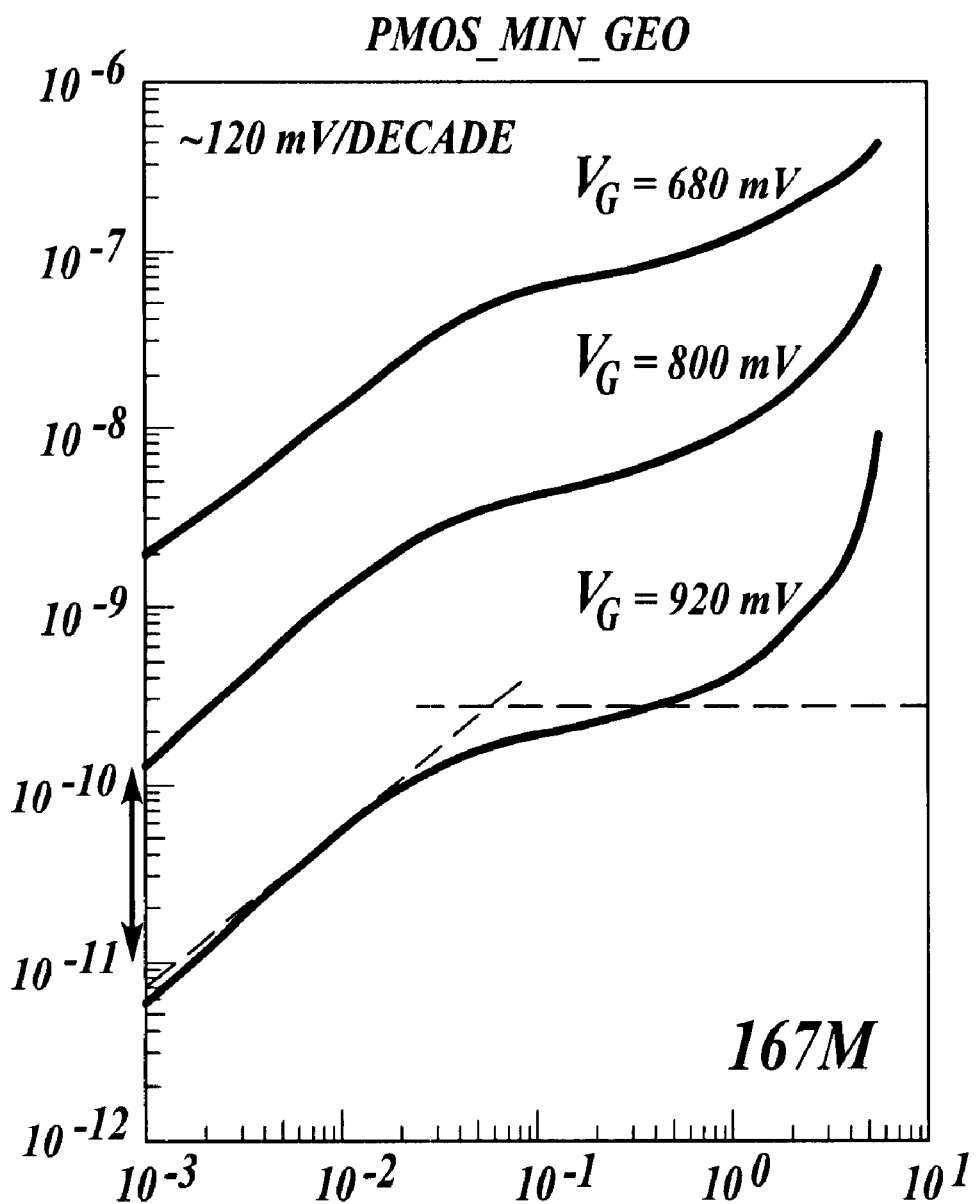
FIG. 3 illustrates a chart of current as a function of drain-source voltage of an exemplary PMOS device, showing a ten fold increase in saturation current per 120 mV change in gate voltage in sub-threshold mode.

FIG. 2 illustrates an integrator circuit 20 according to one embodiment the present invention. Integrator circuit 20 includes a transconductance amplifier resistor implemented with a field effect transistor biased in the sub-threshold mode, in accordance with one embodiment of the present invention. This embodiment is similar to integrate circuit 10 (FIG. 1) except that resistor 13 is implemented with a field effect transistor 2 that is biased by a bias circuit 25 to operate in the sub-threshold mode. By operating in the subthreshold mode, field effect transistor 23 operates as a resistor with high resistance Subthreshold mode resistance performance is described below in conjunction with FIGS. 3 and 4. Transistor 23 and bias circuit 25 require relatively little silicon real estate and dissipate little power in achieving this high resistance. In addition, transistor 23 and bias circuit 25 can be implemented without using bipolar devices, which can advantageously reduce the complexity and cost of fabricating integrator circuit 20.

FIG. 3 illustrates a chart of current as a function of drain-source voltage of an exemplary PMOS process. In this example, a minimum geometry PMOS device (e.g., having a channel width and length of 1 $\mu$m each) is operated in the subthreshold mode with gate voltages that are incremented by 120 mV. As shown in FIG. 3, the gate voltages are 680 mV, 800 mV and 920mV. Each 120 mV increase results in a ten-fold increase in drain saturation current. At low current densities (typically below a nanoAmp for minimum geometry devices), this exemplary PMOS device exhibits a resistance of approximately 52 mV/Idsat when operated in the subthreshold mode, where Idsat represent. the level of the drain saturation current.

Figure 4:
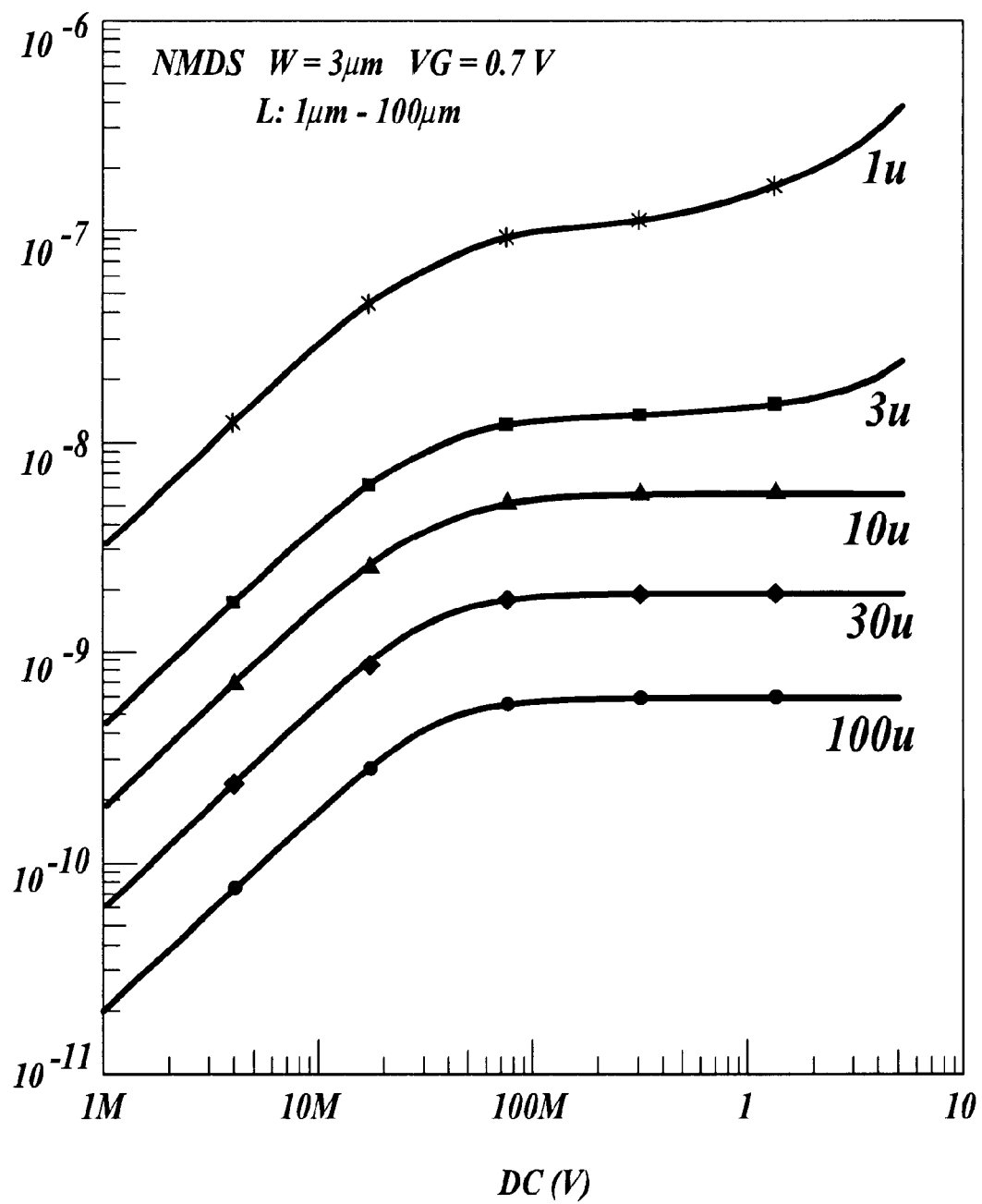
FIG. 4 illustrates a chart of current as a function of drain-source voltage of exemplary NMOS devices having different channel lengths but the same gate voltage.

FIG. 4 illustrates a chart of current as a function of drain-source voltage of an exemplary NMOS process. In this example, the NMOS devices have a gate voltage of 0.7 volts and a width of 3 $\mu$m, with the length ranging from 1 $\mu$m to 100 $\mu$m. FIG. 4 shows that altering the width and length of the NMOS device scales the drain saturation current for reasonably sized transistors. In view of the present disclosure, those skilled in the art of integator circuits can use charts similar to those of FIGS. 3 and 4 (i.e. determines from testing devices of the process to be used in fabricating the integrator circuit) to implement a resistor with a high resistance (i.e., over 100 M$\Omega$). In particular, by selecting the size and the subthreshold biasing of a field effect transistor, the designer can achieve desired resistance.

Figure 5:
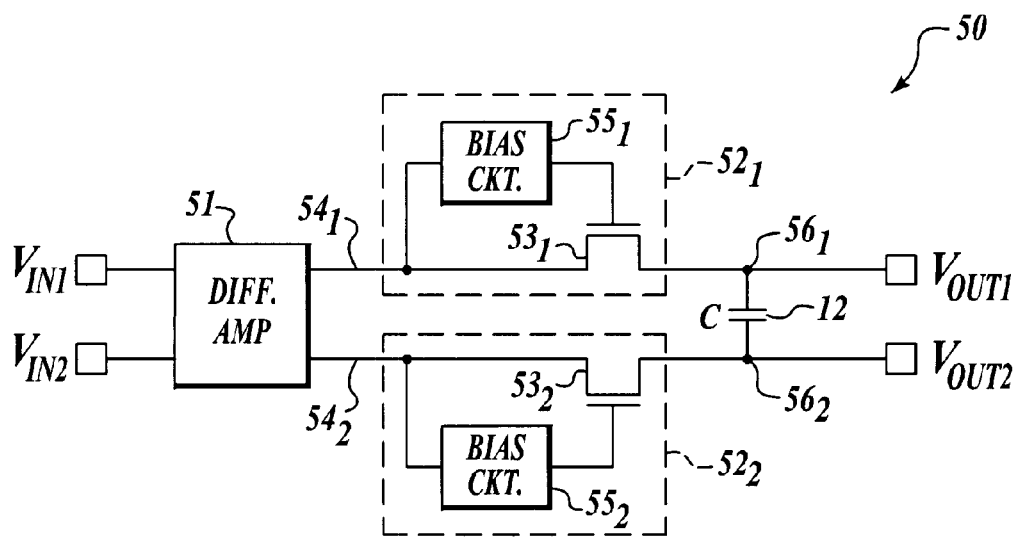
FIG. 5 illustrates a block diagram of a differential integrator circuit having a resistor implemented with a field effect transistor biased in the sub-threshold mode, in accordance with one embodiment of the present invention.

FIG. 5 illustrates a block diagram of a differential integrator circuit 50, in accordance with one embodiment of the present invention. Differential integrator circuit 50 includes a differential amplifier 51, resistors $52_1$, and $52_2$, and capacitor 12. Resistor $52_1$ is implemented with a field effect transistor $53_1$ biased in the sub-threshold mode using a bias circuit $55_1$. Similarly, resistor $52_2$ is implemented with a field effect transistor $53_2$ biased in the sub-threshold mode using a bias circuit $55_2$. In one embodiment, capacitor 12 is implemented with two MOS capacitors connected in parallel. This allows capacitor 12 to have equal leakage on its terminals so that the differential output signal is not offset over time. Field effect transistors $53_1$ and $53_2$ and bias circuits $55_1$ and $55_2$ are fabricated, ideally, to be identical, with bias circuits $55_1$ and $55_2$ sinking identical bias currents.

The elements of differential integrator circuit 50 are interconnected as follows. Differential amplifier 51 has a first input lead connected to receive a signal $V_{IN1}$ and a second input lead connected to receive a signal $V_{IN2}$. Signals $V_{IN1}$ and $V_{IN2}$ form a differential input signal. Differential amplifier 51 outputs a differential output signal through lines $54_1$ and $54_2$. Line $54_1$ is connected to one channel terminal of field effect transistor $53_1$ and bias circuit $55_1$, with bias circuit $55_1$ also being connected to the gate of field effect transistor $53_1$. The other channel terminal of field effect transistor $53_1$ is connected to an electrode (i.e., node $56_1$) of capacitor 12. Similarly, line $54_2$ is connected to one channel terminal of field effect transistor $53_2$ and bias circuit $55_2$, with bias circuit $55_2$ also being connected to the gate of field effect transistor $53_2$. The other channel terminal of field effect transistor $53_2$ is connected to the other electrode (i.e., node $56_2$) of capacitor 12. The voltage across capacitor 12 serves as the differential output signal of integrator circuit 50.

In operation, differential integrator 50 is fully differential, being non-responsive to common mode voltages and currents. Further, the symmetry of the circuit cause any change in voltage or current on one side of capacitor 12 to result in an equal but opposite change in voltage or current on the other side of capacitor 12. Consequently, the average or common mode voltage across capacitor 12 remains constant; i.e., capacitor 12 floats.

Differential integrator 50 performs the integration function as follows. When the levels of signals $V_{IN1}$, and $V_{IN2}$ are equal, differential amplifier 51 outputs equal voltage to lines $54_1$, and $54_2$. The only DC current paths to the electrodes of capacitor 12 are through field effect transistors $53_1$ and $53_2$ on to lines 541 and 542. Therefore, no voltage appear across capacitor 12.

However, when the levels of signals $V_{IN1}$ and $V_{IN2}$ are not equal, differential amplifier 51 causes unequal voltages and currents to be present on lines $54_1$, and $54_2$. For example, when the differential input signal causes the voltage level on line $54_1$ to drop (and conversely, the voltage level on line $54_2$ to increase), field effect transistor $53_1$ conducts less current (and conversely, field effect transistor $55_2$ conducts more current). Consequently, more current flows through node $56_2$ than through node $56_1$, thereby causing current to flow through capacitor 12 from node $56_2$ to node $56_1$. The resultant voltage appearing across capacitor 12 forces the voltage at node $56_2$ to increase and that at node $56_2$ to decrease. Further, the symmetrical design causes the increase in voltage at node $56_2$ to be matched by an equal decrease in voltage at node $56_1$. The voltage across capacitor 12 is dependent on the integral of the differential input voltage (i.e., $V_{IN1}-V_{IN2}$).

As previously described, field effect transistors $53_1$ and $53_2$ are sized and biased to operate in the sub-threshold mode to implement a relatively large resistance. For example, with a length ranging from 100 μm to 2000 μm and a width ranging from 3 μm to 10 μm and biased from a transistor that conducts a saturation current of 1 μA or lower, resistances well over 100 MΩ can be achieved. This relatively high resistance can be achieved in a relatively small area of ranging from 100 μm×100 μm to about 500 μm×500 μm and allows capacitor 12 to be relatively small with a capacitance ranging from 5 pF to 20 pF. Further, biasing the field effect transistors requires relatively little power, on the order of 10 μW. This small size and power dissipation can be a tremendous advantage in low voltage battery-powered applications. Still further, field effect transistors $53_1$ and $53_2$ and bias circuits $55_1$ and $55_2$ can be implemented in a pure CMOS, thereby reducing complexity and cost relative to a design that requires bipolar devices.

Figure 6:
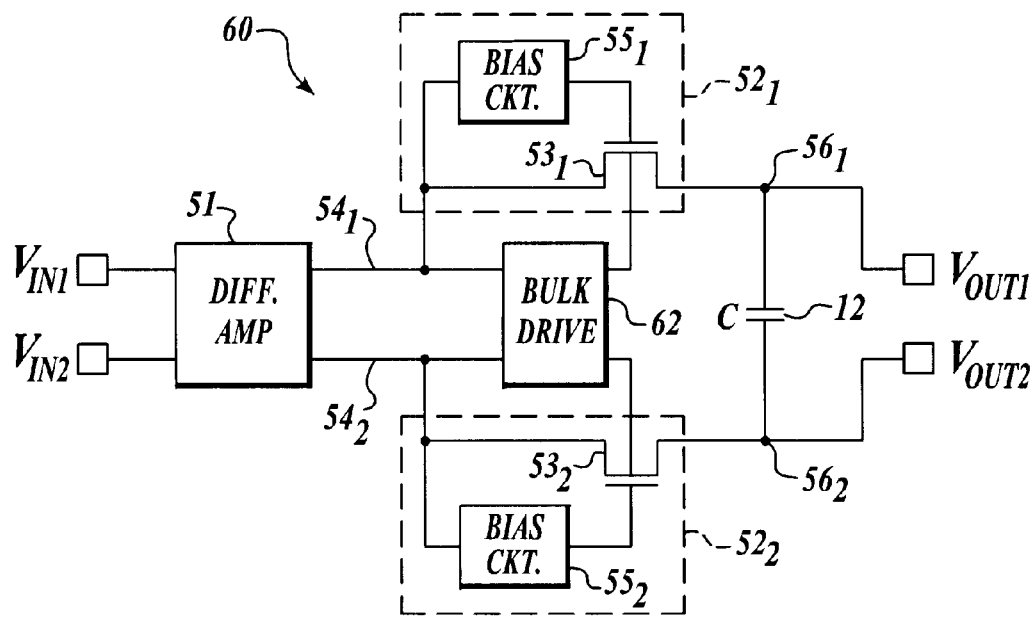
FIG. 6 illustrates a block diagram of a differential integrator circuit as FIG. 5 with the addition of a bulk drive circuit, in accordance with one embodiment the present invention.

FIG. 6 illustrates a block diagram of a differential integrator circuit 60, according to another embodiment of the present invention. Differential integrator circuit 60 is substantially similar to differential integrator circuit 50 (FIG. 5), but with the addition of a bulk drive circuit 62. Bulk drive circuit 62 is connected to lines $54_1$ and $54_2$, which allows bulk drive circuit 62 to receive differential mode noise. Bulk drive circuit 62 is also connected to the bulks of field effect transistors $53_1$ and $53_2$. Bulk drive circuit 62 includes capacitance (not shown) that operates to cancel high frequency noise. Otherwise, differential integrator circuit 60 operates as described above for differential integrator circuit 50 (FIG. 5). One embodiment of bulk drive circuit 62 is described below in conjunction with FIG. 7.

Figure 7:
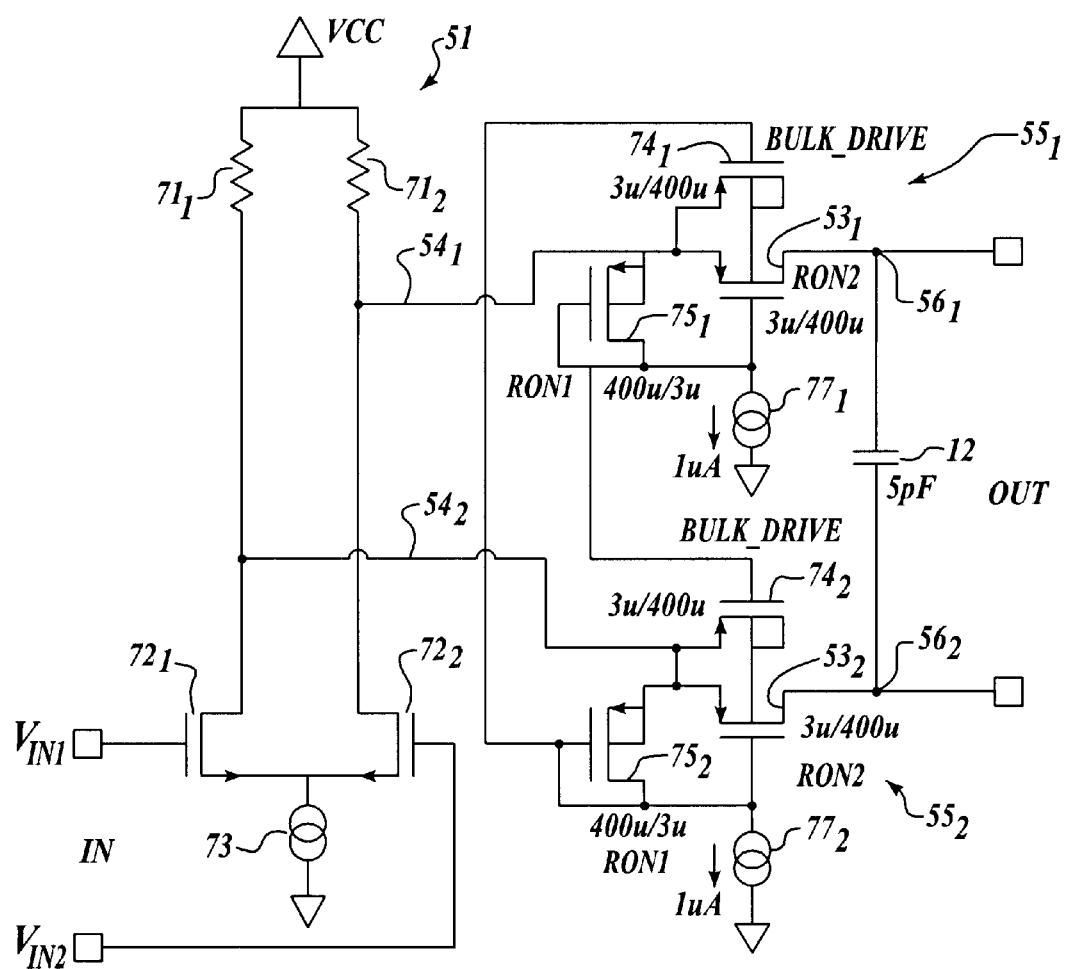
FIG. 7 illustrates a circuit diagram of one implementation of the integrator circuit of FIG. 6, according to one embodiment of the present invention.

FIG. 7 illustrates a circuit diagram of one implementation of the integrator circuit 60 (FIG. 6), according to one embodiment of the present invention. In this embodiment, differential amplifier 51 is implemented with resistors $71_1$ and $71_2$, source-coupled N-channel transistors $72_1$ and $72_2$ and a current source 73. Resistors $71_1$ and $71_2$ connect the VCC bus to the drains of N-channel transistors $72_1$ and $72_2$, respectively. Current source 73 is connected to the sources of N-channel transistors $72_1$ and $72_2$, which in turn have their gates connected to receive signals $V_{IN1}$ and $V_{IN2}$, respectively. N-channel transistors $72_1$ and $72_2$ also have their drains connected to lines $54_1$ and $54_2$, respectively.

Bulk drive circuit 62 is implemented using field-effect transistors $74_1$ and $74_2$, which are sized to match field effect transistors $53_1$ and $53_2$. In this embodiment, field effect transistors $74_1$, $74_2$, $53_1$ and $53_2$ are P-channel MOSFETs with a width of 3 μm and a length of 400 μm. As previously described, in other embodiments the sizes of these transistors may range from a width of 3 μm to 10 μm and a length of 100 μm to 2000 μm to achieve resistances from 100 MΩ to well over 3000 MΩ when operated in the sub-threshold mode. Field effect transistor $74_1$ has one channel terminal connected to (or implemented by) the bulk and its other channel terminal connected to line $54_1$. Similarly, field effect transistor $74_2$ has one channel terminal connected to (or implemented by) the bulk and its other channel terminal connected to line $54_2$. The gates of field effect transistors $74_1$ and $74_2$ are connected to the gates of field effect transistors $53_2$ and $53_1$, respectively. Field effect transistors $74_1$ and $74_2$ implement a differential bulk drive circuit having capacitance (i.e., the gate capacitance of the transistors) cancels high frequency noise injected into the bulk providing an equal and opposite signal that is also coupled into the bulk.

Bias circuits $55_1$ and $55_2$ are implemented using MOS diode $75_1$ and current source $77_1$, and MOS diode $75_2$ and current source $77_2$, respectively. MOS diode $75_1$ has its anode connected to line $54_1$ and has its cathode connected to current source $77_1$ and the gate of field effect transistor $53_1$. Similarly, MOS diode $75_2$ has its anode connected to line $54_2$ and has its cathode connected to current source $77_2$ and the gate of field effect transistor $53_2$. The sizes of the MOS diodes and the current sources are selected to achieve a gate-to-source voltage that biases field effect transistors $53_1$, $53_2$, $74_1$ and $74_2$ in the sub-threshold mode to achieve a desired resistance. In this embodiment, MOS diodes $75_1$ and $75_2$ are implemented with matching P-channel field effect transistors having a width of 400 $\mu$m and a length of 3 $\mu$m. Also, current sources $77_1$ and $77_2$ are ideally matching current sources, which in this embodiment are each configured to sink a 1 $\mu$A current. In other embodiments, the sizes of field effect transistors $75_1$ and $75_2$ and current sources $77_1$ and $77_2$ can be different as needed to properly bias field effect transistors $53_1$, $53_2$, $74_1$ and $74_2$ in the sub-threshold mode to achieve different desired resistances.

Differential integrator 70 performs the integration function as follows. When the levels of signals $V_{IN1}$ and $V_{IN2}$ are equal, field effect transistors $72_1$ and $72_2$ conduct equal currents that result in equal voltages at lines $54_1$ and $54_2$. Since lines $54_1$ and $54_2$ provide (through field effect transistors $53_1$ and $53_2$) the only current path to the electrodes of capacitor 12, the voltage across capacitor 12 is therefore equal.

However, when the levels of signals $V_{IN1}$ and $V_{IN2}$ are not equal, field effect transistors $72_1$ and $72_2$ of differential amplifier 51 conduct unequal currents. This unequal current flow causes unequal voltages at lines $54_1$ and $54_2$ Since these two lines provide (through field effect transistors $53_1$ and $53_2$) the only current path to the electrodes of capacitor 12, the voltage across capacitor 12 is therefore as unequal by the same average amount. Because of the high resistances of field effect transistors $53_1$ and $53_2$, the variation in voltages at lines $54_1$ and $54_2$ will get integrated over time by capacitor 12. The voltage across capacitor 12 is dependent on the integral of the differential input voltage (i.e., $V_{IN1}-V_{IN2}$).

In a further refinement, the sizes of field effect transistors $53_1$, $53_2$, $74_1$, and $74_2$ and current sources $77_1$ and $77_2$ may be programmable. For example, additional transistors may be programmably connected in parallel to field effect transistor $53_1$ to increase its size. In this way, the resistance provided by field effect transistor $53_1$ may be trimmed as desired to account for process variations. This programming can be performed using mask programmable techniques, laser trimming, fuse or antifuse programming, or non-volatile memory.

The above specification, examples and data provide a complete description of the manufacture and use of the composition of the invention. In light of the present disclosure, many embodiments of the invention can be made without departing from the spirit and scope of the invention by those skilled in the art of integrator circuits. For example, although a PMOS resistor implementation is described, those skilled in the art can fabricate a NMOS resistor implementation without undue experimentation. Accordingly, the invention is not to be limited to those embodiments disclosed, but rather, the invention resides in the claims hereinafter appended.

I claim:

1. An integrator circuit comprising:

a differential amplifier;

a first field effect transistor coupled to a first output terminal of the differential amplifier;

a second field effect transistor coupled to a second output terminal of the differential amplifier;

a first bias circuit coupled to the first field effect transistor, wherein the first bias circuit is configured to bias the first field effect transistor in a sub-threshold mode;

a second bias circuit coupled to the second field effect transistor, wherein the second bias circuit is configured to bias the second field effect transistor in a sub-threshold mode;

a capacitor having a first electrode coupled to the first field effect transistor and having a second electrode coupled to the second field effect transistor; and a bulk drive circuit coupled to a bulk, the first and second field effect transistors being formed in the bulk, wherein the bulk drive circuit is configured to cancel noise injected into the bulk.

2. The integrator circuit of claim 1 wherein the bulk drive circuit comprises third and fourth field effect transistors, the third field effect transistor being coupled to the first output terminal of the differential amplifier and to the gate of the second field effect transistor, the fourth field effect transistor being coupled to the second output terminal of the differential amplifier and to the gate of the first field effect transistor.

3. The integrator circuit of claim 1 wherein the first bias circuit comprises a constant current source.

4. The integrator circuit of claim 3 wherein the constant current source is programmable.

5. The integrator circuit of claim 3 wherein the first bias circuit further comprises a transistor coupled to the first output terminal and to the constant current source.

6. The integrator circuit of claim 1 wherein the resistances provided by the first and second field effect transistors are programmable.

7. An integrator circuit comprising:

a differential amplifier;

a first field effect transistor coupled to a first output terminal of the differential amplifier;

a second field effect transistor coupled to a second output terminal of the differential amplifier first bias means, coupled to the first field effect transistor, for biasing the first field effect transistor in a sub-threshold mode;

second bias means, coupled to the second field effect transistor, for biasing the second field effect transistor in a sub-threshold mode;

a capacitor having a first electrode coupled to the first field effect transistor and having a second electrode coupled to the second field effect transistor; and a bulk drive means, coupled to a bulk, for canceling noise injected into the bulk, the first and second field effect transistors being formed in the bulk.

8. The integrator circuit of claim 7 wherein the bulk drive means comprises third and fourth field effect transistors, the third field effect transistor being coupled to the first output terminal of the differential amplifier and to the gate of the second field effect transistor, the fourth field effect transistor being coupled to the second output terminal of the differential amplifier and to the gate of the first field effect transistor.

9. The integrator circuit of claim 7 wherein the first bias means comprises a constant current source.

10. The integrator circuit of claim 9 wherein the constant current source is programmable.

11. The integrator circuit of claim 9 wherein the first bias means further comprises a transistor coupled to the first output terminal and to the constant current source.

12. The integrator circuit of claim 7 wherein the resistances provided by the first and second field effect transistors are programmable.

* * * * *